United States Patent
Yam et al.

(10) Patent No.: US 10,134,722 B2
(45) Date of Patent: Nov. 20, 2018

(54) EMBEDDED PMOS-TRIGGER SILICON CONTROLLED RECTIFIER (SCR) WITH SUPPRESSION RINGS FOR ELECTRO-STATIC-DISCHARGE (ESD) PROTECTION

(71) Applicant: Hong Kong Applied Science and Technology Research Institute Company, Limited, Hong Kong (HK)

(72) Inventors: Chun-Kit Yam, Hong Kong (HK); Xiao Huo, Hong Kong (HK)

(73) Assignee: Hong Kong Applied Science and Technology Research Institute Company Limited, Hong Kong (HK)

( * ) Notice: Subject to any disclaimer, the term of this patent is extended or adjusted under 35 U.S.C. 154(b) by 42 days.

(21) Appl. No.: 15/485,382

(22) Filed: Apr. 12, 2017

(65) Prior Publication Data

US 2018/0301445 A1    Oct. 18, 2018

(51) Int. Cl.
*H01L 27/06* (2006.01)
*H01L 27/02* (2006.01)
(Continued)

(52) U.S. Cl.
CPC ...... *H01L 27/0262* (2013.01); *H01L 27/0266* (2013.01); *H01L 27/0635* (2013.01);
(Continued)

(58) Field of Classification Search
CPC ......... H01L 27/0255–27/0292; H01L 27/0921
See application file for complete search history.

(56) References Cited

U.S. PATENT DOCUMENTS 5,754,381 A * 5/1998 Ker .................. H01L 27/0251
361/56
7,071,528 B2   7/2006 Ker et al.
(Continued)

FOREIGN PATENT DOCUMENTS

| CN | 1855494 A | 11/2006 |
| CN | 101789428 A | 7/2010 |
| CN | 105702675 A | 6/2016 |

OTHER PUBLICATIONS

ISR and Written Opinion, PCT/CN2017/080856, dated Jan. 17, 2018.
(Continued)

*Primary Examiner* — Stephen Bradley
(74) *Attorney, Agent, or Firm* — Stuart T. Auvinen; gPatent LLC

(57) ABSTRACT

An Electro-Static-Discharge (ESD) protection device has a Silicon-Controlled Rectifier (SCR) with a triggering PMOS transistor. The SCR is a PNPN structure with a P+ anode/source within a center N-well, a P-substrate, and an outer N-well that connects to a cathode using N+ well taps. The P+ anode/source is both the source of the triggering PMOS transistor and the anode of the SCR. A trigger circuit drives the gate of the triggering PMOS transistor low, turning it on to charge the P+ drain. Since the P+ drain straddles the well boundary, making physical contact with both the center N-well and the P-substrate, holes flow into the P-substrate. The P+ drain is located near guard rings that suppress latch-up. The holes from the P+ drain flood the region under the guard rings, temporarily weakening their effect and reducing the trigger voltage.

17 Claims, 15 Drawing Sheets

(51) Int. Cl.
  *H01L 29/10* (2006.01)
  *H01L 29/08* (2006.01)
  *H01L 29/06* (2006.01)
  *H01L 49/02* (2006.01)

(52) U.S. Cl.
  CPC .............. *H01L 28/20* (2013.01); *H01L 28/40* (2013.01); *H01L 29/0619* (2013.01); *H01L 29/0834* (2013.01); *H01L 29/0839* (2013.01); *H01L 29/0847* (2013.01); *H01L 29/1095* (2013.01)

(56) References Cited

U.S. PATENT DOCUMENTS

| | | | |
|---|---|---|---|
| 7,675,127 B1* | 3/2010 | Worley | H01L 27/027 257/409 |
| 8,102,001 B2 | 1/2012 | Ker et al. | |
| 8,842,400 B2 | 9/2014 | Ker et al. | |
| 9,041,054 B2 | 5/2015 | Van Wijmeersch et al. | |
| 9,130,010 B2 | 9/2015 | Lai | |
| 9,437,591 B1 | 9/2016 | Nidhi et al. | |
| 2003/0174452 A1* | 9/2003 | Chen | H01L 27/0255 361/56 |
| 2004/0100745 A1 | 5/2004 | Chen et al. | |
| 2007/0018193 A1* | 1/2007 | Ker | H01L 27/0262 257/119 |
| 2017/0069616 A1 | 3/2017 | Cai et al. | |
| 2017/0346277 A1* | 11/2017 | Su | H02H 9/044 |

OTHER PUBLICATIONS

Gonnard et al., "Multi-ring Active Analogic Protection for Minority Carrier Injection Suppression in Smart Power Technology", Proc. 2001 Int'l Sym. Power Semi. Dev. & IC's, Osaka, 9.45, pp. 351-354, 2001.

* cited by examiner

EMBEDDED PMOS-TRIGGER SILICON CONTROLLED RECTIFIER (SCR) WITH SUPPRESSION RINGS FOR ELECTRO-STATIC-DISCHARGE (ESD) PROTECTION

FIELD OF THE INVENTION

This invention relates to electro-static-discharge (ESD) protection circuits, and more particularly to Silicon-Controlled Rectifier (SCR) structures that have ESD-protection Metal-Oxide-Semiconductor Field-Effect Transistor (MOSFET) integrated within them.

BACKGROUND OF THE INVENTION

Many kinds of Integrated circuits (IC's) are prone to damage and failure from an electro-static-discharge (ESD) pulse. ESD failures that occur in the factory contribute to lower yields. ESD failures may also occur in the field when an end-user touches a device.

Various ESD-protection structures have been placed near input, output, or bi-directional I/O pins of ICs. Many of these protection structures use passive components such as series resistors, diodes, and thick-oxide transistors. Other ESD structures use an active transistor to safely shunt ESD current.

As manufacturing ability improves and device sizes shrink, lower voltages are applied to transistors during normal operation. These smaller transistors are much more susceptible to over-voltage failure but can operate with a lower power-supply voltage, thus consuming less power and producing less heat.

Such smaller transistors are often placed in an internal "core" of an IC, while larger transistors with gate lengths that are above the minimum are placed around the core in the periphery. ESD-protection structures are placed in the periphery using these larger transistors.

Thinner gate oxides of the core transistors can be shorted, and substrate junctions melted, by relatively small capacitively-coupled currents applied to the tiny core devices. Static charges from a person or machinery can produce such damaging currents that are only partially blocked by the input-protection circuits in the periphery.

FIG. 1 shows a chip with several ESD-protection clamps. Core circuitry 20 contains core transistors 22, 24, which have a small channel length and can be damaged by currents at relatively low voltages. Core circuitry 20 receives a power supply voltage VDD, such as 1.8 volts, 1.2 volts, or some other value. There may be thousands of core transistors in core circuitry 20.

Protection from ESD pulses may be provided on each I/O pad, and by power clamp 26. Power clamp 26 is coupled between VDD and ground (VSS), and shunts current from an ESD pulse between the power rails.

Some cross-coupling may occur between different pads and core circuitry 20, such as through substrates and capacitances. An ESD pulse applied to one I/O pad 10 may be coupled into core circuitry 20 by this cross-coupling, causing damage to transistors 22, 24 in core circuitry 20. Power clamp 26 may shunt enough current from the ESD pulse to reduce such cross-coupling to prevent damage. ESD pulses applied to I/O pins may still couple into core circuitry 20, such as through power lines, but power clamp 26 may then be activated to reduce potential damage.

Power clamp 26 may also turn on for other ESD pulses such as those applied to I/O pins, when the ESD pulse is shunted through a diode in the I/O pin's ESD-protection structure to the internal VDD rail, causing an indirect VDD-to-VSS ESD pulse. For example, an ESD pulse applied to I/O pad 10 may cause ESD protection device 12 to turn on to conduct to VDD.

Each I/O pad 10 may be outfitted with one or more ESD protection devices 12, 16 to protect against various possibilities. ESD protection device 16 turns on for a positive ESD pulse applied from ground to I/O pad 10, while ESD protection device 18 turns on for a positive ESD pulse applied from ground to I/O pad 10. Likewise, ESD protection device 12 turns on for a positive ESD pulse applied from I/O pad 10 to VDD while ESD protection device 14 turns on for a positive ESD pulse applied from I/O pad 11 to VDD. Power clamp 26 may also turn on in some situations.

Some prior-art ESD protection structures have large-area capacitors, resistors, or transistors. Large size devices are expensive and undesirable. Some prior-art ESD-protection devices are not suited for standard CMOS processes, such as ESD-protection devices that use insulator layers in Silicon-On-Insulator (SOI) processes.

Diodes have been uses as ESD-protection structures, but the diode's I-V characteristics allow for high voltages when large ESD currents flow, and these high voltages can still damage core transistors. Some ESD-protection structures use two diodes in series rather than one diode, but such stacked diodes are undesirable in some environments due to the increased voltage drop of two diodes in series.

Silicon-Controlled Rectifiers (SCR's) have also been used successfully. Both an SCR and a diode may be used. However, simply having a diode and an SCR in an ESD-protection structure may produce erratic results that depend on the relative locations of the SCR and diode and other structures such as guard rings.

FIG. 2 shows a safe design window for an ESD protection device. I-V curve 94 shows the current flowing through a prior-art ESD structure as a function of the ESD pulse voltage.

Initially, at the start of an ESD event, the device is off. I-V curve 94 shows that the voltage rises from zero as a diode or other device turns on and conducts current until trigger voltage $V_{TRIG}$. Above this trigger voltage, other devices in the ESD structure turn on, such as a MOS transistor or an SCR, allowing a larger current to flow. Just after trigger voltage $V_{TRIG}$, as the current increases, the diode or SCR shunts the most current, and an avalanche current or similar mechanism may decrease the voltage, causing the snap-back of I-V curve 94. The lowest voltage during snap back is holding voltage $V_{HOLD}$.

The holding voltage $V_{HOLD}$ should be greater than the power-supply voltage VDD to ensure that latch-up does not occur. Also, the maximum voltage, such as trigger voltage $V_{TRIG}$, should be less than the device breakdown voltage $V_{BD}$ to ensure that permanent damage does not occur. Thermal failure can occur when breakdown voltage $V_{BD}$ is exceeded for too long of a period of time. IC reliability is enhanced when the ESD protection structure operates within the safe design window, so that I-V curve 94 operates between VDD and $V_{BD}$.

Actual device curves may vary and show secondary effects not shown in simplified I-V curve 94. As IC processing technology improves and shrinks, $V_{BD}$ decreases due to thinner gate oxides and smaller device sizes in general. Also, VDD may be reduced. Thus the safe design window may shift and shrink.

FIG. 3 shows a design window for a single-SCR ESD structure manufactured by an advanced process. The advanced IC process uses smaller devices with a reduced $V_{BD}$, and VDD has also been reduced. An ESD structure that uses a single SCR has an I-V characteristic shown by I-V curve 94. The holding voltage $V_{HOLD}$ is less than VDD in this example. The ESD structure will be susceptible to latch up failure.

Sometimes a guard ring is added to suppress latch up. A pair of connected diffusions that act as guard rings to suppress minority carriers may be added to a lateral SCR to increase the holding voltage. Multi-Ring Active Analogic Protection (MAAP) is sometimes used. However, the trigger voltage may still be increased above the breakdown voltage $V_{BD}$.

FIG. 4 shows a design window for a dual-SCR ESD structure manufactured by an advanced process. This ESD structure has two SCR's that are stacked in series. An ESD structure that uses a single SCR has an I-V characteristic shown by I-V curve 94, while the stacked dual-SCR structure has an I-V characteristic shown by I-V curve 96. The holding voltage $V_{HOLD}$ of the stacked SCR curve 96 is now more than VDD, reducing susceptibility to latch up failure. However, the trigger voltage $V_{TRIG}$ of the stacked SCR's is greater than the device breakdown voltage $V_{BD}$. The ESD structure likely will have lower reliability and be more susceptible to thermal failure. Also the slope of curve 96 is less than the slope of curve 94, so the on resistance $R_{ON}$ is increased, which can lower ESD structure efficiency and increase the ESD structure turn-on time.

It is desired to have an ESD protection structure that has an I-V curve 94 that fits within the design window, even for advanced IC processes with tight design windows. It is desired to raise the holding voltage $V_{HOLD}$ to be greater than VDD, without increasing the trigger voltage $V_{TRIG}$ above the breakdown voltage $V_{BD}$.

It is desired to have a single SCR to avoid increasing the trigger voltage $V_{TRIG}$ above the breakdown voltage $V_{BD}$. An electro-static-discharge (ESD) protection circuit with one SCR and a PMOS transistor is desired. An ESD protection device featuring parallel PMOS and SCR paths to allow for better optimization is desirable. Tightly integrating a PMOS transistor and an SCR is desired.

DETAILED DESCRIPTION

The present invention relates to an improvement in ESD protection circuits. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors realize that an ESD-protection device having both an SCR and a p-channel transistor can be constructed by tightly integrating the PMOS transistor into the SCR structure. In particular, the inventors realize that the p-channel transistor may be placed in the middle of the SCR layout.

The inventors realize that guard rings are useful to suppress minority carriers, raising the holding voltage and thus reduce latch-up susceptibility. However, once the SCR in the ESD structure begins to turn on, the guard rings can reduce the turn-on speed of the SCR. The inventors add a PMOS transistor near the guard rings to temporarily suppress the effect of the guard rings during an ESD event. The PMOS transistor turns on during an ESD event, and floods the guard rings with minority carriers, causing the effect of the guard rings to be temporarily suppressed. The SCR can then turn on fully as if the guard rings were not present. The SCR can turn on at a lower voltage when the PMOS suppresses the guard rings, allowing the trigger voltage $V_{TRIG}$ to be reduced. The PMOS transistor turns off later during the ESD event, raising the holding voltage of the guard rings, temporarily suppressing the effect of the guard rings.

The lower trigger voltage allows the ESD structure to fit within the design window, with $V_{TRIG}$ less than $V_{BD}$. During normal operation, the PMOS transistor remains off, allowing the guard rings to suppress minority carriers and reduce latch up, thus raising the holding voltage $V_{HOLD}$.

Figure 5:
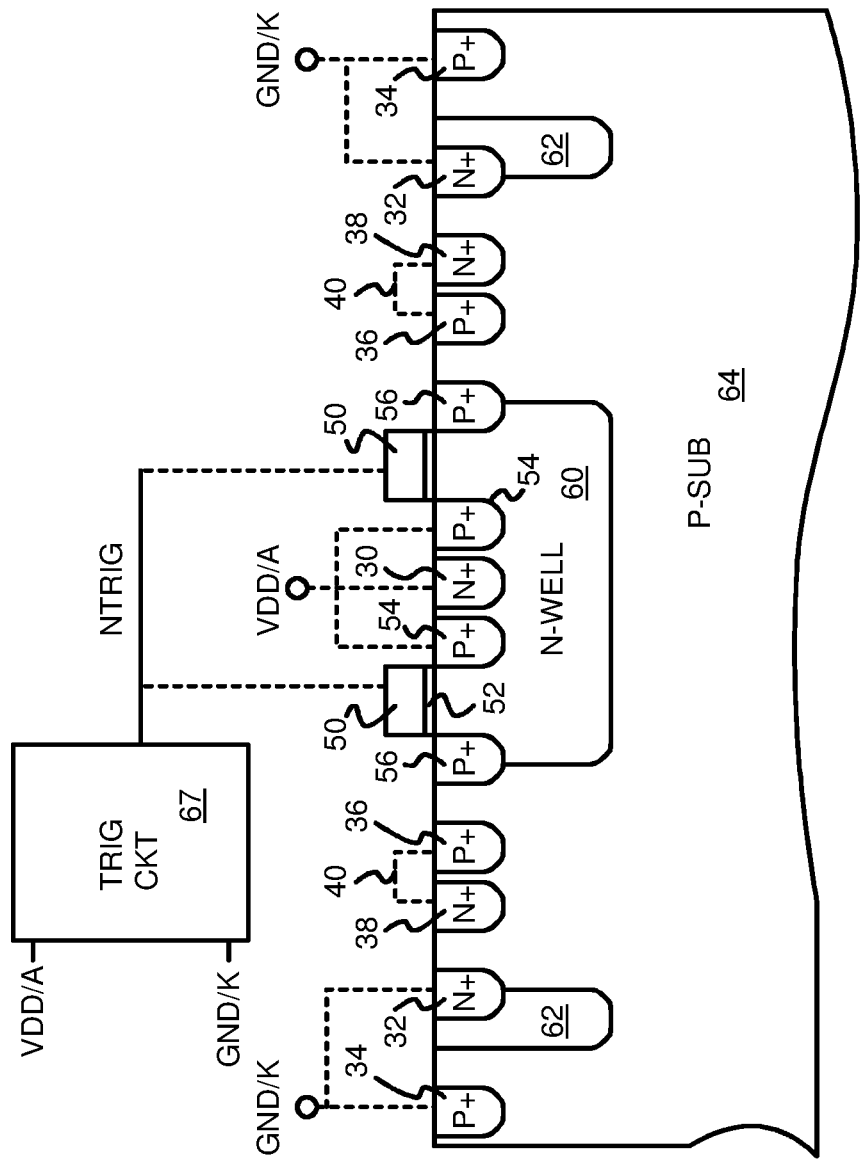
FIG. 5 is a cross-section of an ESD protection device with an SCR, a guard ring, and a MOS triggering transistor to trigger ESD protection.

FIG. 5 is a cross-section of an ESD protection device with an SCR, a guard ring, and a MOS triggering transistor to trigger ESD protection. The SCR is a P-N-P-N structure from Anode A to P+ anode/source 54, down to center N-well 60, then to P-substrate 64, before ending at outer N-well 62 tapped by N+ well taps 32 to connect to the cathode K.

Outer N-well 62 is connected to ground by N+ well taps 32 during normal operation. P+ well tap 34 connects P-substrate 64 to cathode K, which is grounded during normal operation. Center N-well 60 is biased by center N+ tap 30, which connects to the anode during ESD testing, and to power VDD during normal operation.

P+ anode/source 54 and center N+ tap 30 are formed at the surface within center N-well 60 and are both connected to the anode A during ESD testing, or to VDD during normal chip operation.

A triggering PMOS transistor is formed between P+ anode/source 54 and P+ drain 56. Gate oxide 52 is formed under gate 50 between P+ anode/source 54 and P+ drain 56. Gate 50 formed over gate oxide 52 may be a polysilicon gate. There may be two or more PMOS transistors formed by two or more gates 50, with two or more P+ drains 56 and P+ anode/sources 54. In the example of FIG. 5, there are two gates 50 and two PMOS transistors shown in this cross-section.

Gate 50 is driven by inverse trigger signal NTRIG that is generated by trigger circuit 67. During normal operation, trigger circuit 67 drives NTRIG high, causing gate 50 to remain high and turning off the PMOS transistors. When an ESD pulse occurs across the anode and cathode terminals input to trigger circuit 67, trigger circuit 67 drives NTRIG low for a short period of time. The low NTRIG applied to gates 50 of the PMOS transistors turns them on. Current flows from P+ anode/source 54, across the channel formed under gate 50 of the PMOS transistor to P+ drain 56.

P+ drain 56 preferably straddles the edge of center N-well 60. The current collected by P+ drain 56 can then be injected into P-substrate 64. This current injected by P+ drain 56 temporarily suppresses the action of nearby P+ guard ring 36 and N+ guard ring 38. P+ guard ring 36 and N+ guard ring 38 normally act to intercept minority carriers in P-substrate 64 to reduce latch-up susceptibility, but these guard rings also would raise the trigger voltage of the SCR. However, when the PMOS transistors turn on, P+ drain 56 injects carriers in the region near and under P+ guard ring 36 and N+ guard ring 38, suppressing their effect on the SCR trigger voltage.

P+ guard ring 36 and N+ guard ring 38 may be connected together by metal connector 40, which may be floating, grounded, or connected to cathode K. Alternately, P+ guard ring 36 and N+ guard ring 38 may be connected together by a resistor, or could be connected to a fixed voltage such as VDD or ground, although latch-up immunity might be reduced somewhat. Gate 50 may be grounded during normal chip operation, but floating during some ESD tests, such as pin-to-pin ESD tests that only connect to two I/O pins at a time.

Figure 6:
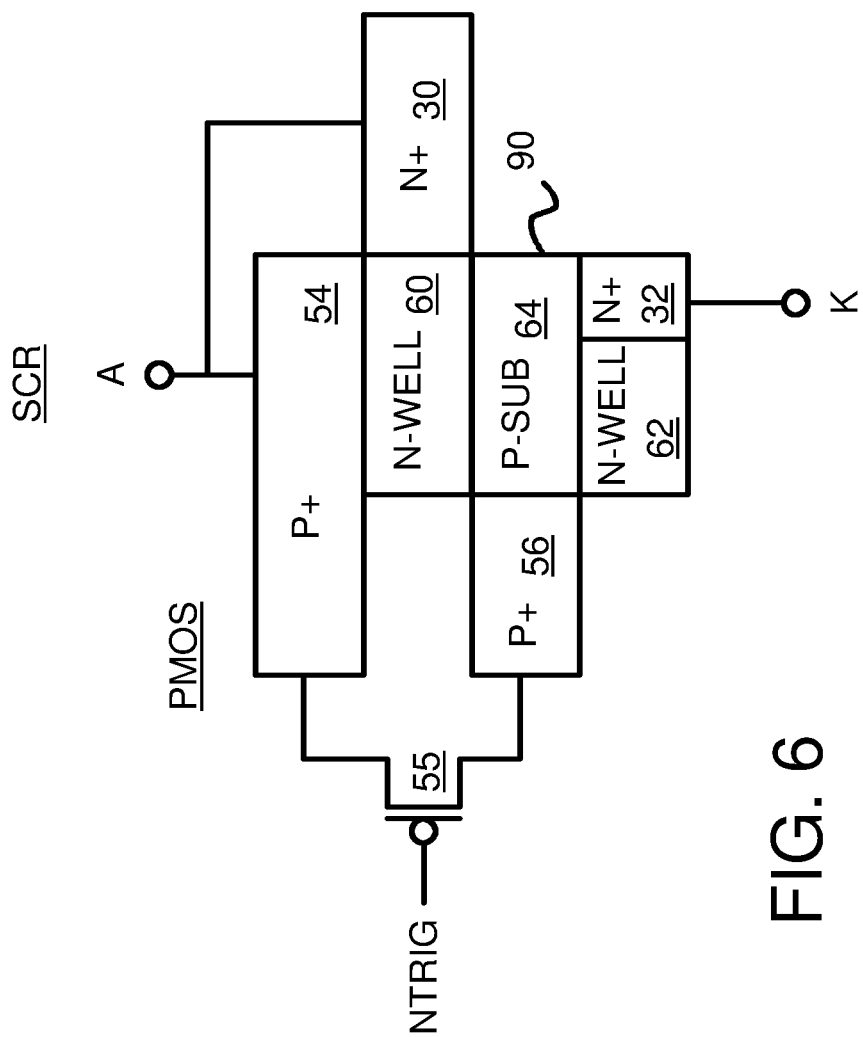
FIG. 6 is a diagram of the ESD structure of FIG. 5.

FIG. 6 is a diagram of the ESD structure of FIG. 5. An ESD pulse is applied across nodes A, K. Anode A connects to P+ anode/source 54, while cathode K connects to N+ well taps 32 that connect to outer N-well 62.

SCR 90 is a P-N-P-N structure from Anode A to P+ anode/source 54, down to center N-well 60, then to P-substrate 64, before ending at outer N-well 62 that have N+ well taps 32 at the chip surface that connect to the cathode K. The anode A also connects to center N+ tap 30, which connects to center N-well 60. In the alternative embodiment of FIG. 10, resistor 48 (not shown in FIG. 6) is inserted between anode A and center N+ tap 30.

SCR 90 is a large structure that can conduct a large current from Anode A to cathode K. However, it is difficult to turn on an SCR. Triggering PMOS transistor 55 is added between P+ anode/source 54 and P+ drain 56. When triggering PMOS transistor 55 turns on, current bypasses center N-well 60, which has a high resistance due to the low doping and large area of center N-well 60. This initial current through triggering PMOS transistor 55 floods the area in P-substrate 64 around P+ guard ring 36 and N+ guard ring 38 with carriers, suppressing the trigger-voltage-raising effect of the guard rings on the SCR. A lower trigger voltage results from the use of triggering PMOS transistor 55.

Triggering PMOS transistor 55 floods P-substrate 64 with carriers to permit conduction within of SCR 90. As conduction continues, the voltage remains high in P-substrate 64 to permit SCR 90 to remain on, even after triggering PMOS transistor 55 is turned off by trigger circuit 67 (FIG. 5).

Figure 7:
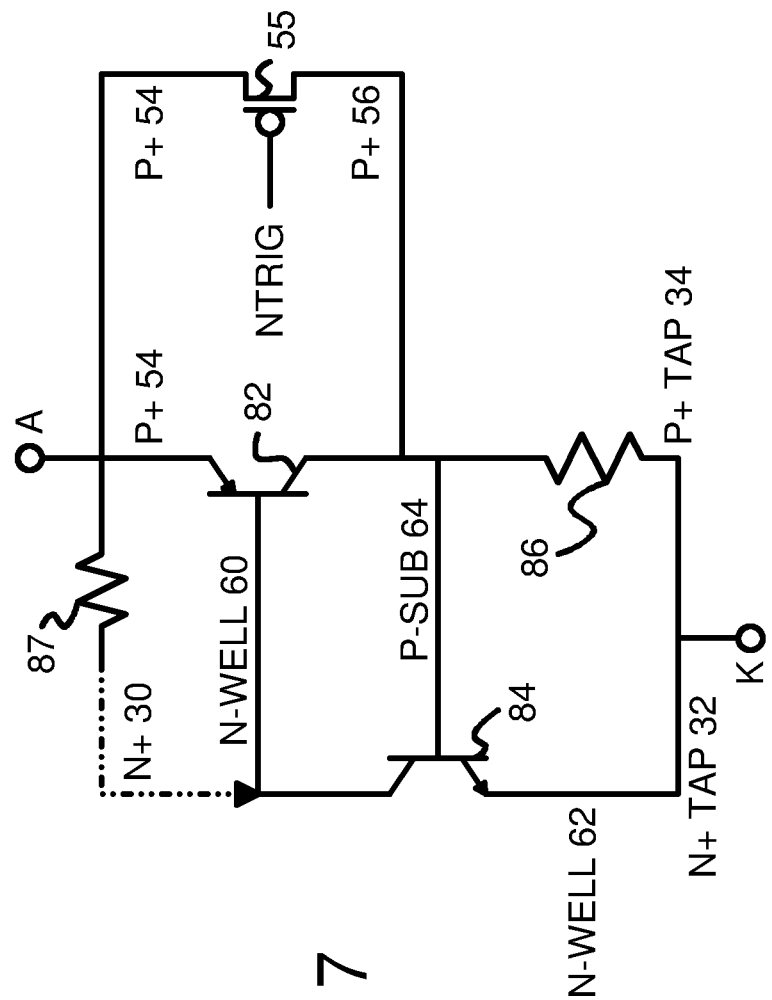
FIG. 7 is a schematic diagram of the ESD-protection structure.

FIG. 7 is a schematic diagram of the ESD-protection structure. Triggering PMOS transistor 55 is connected between anode A (P+ anode/source 54) and P+ drain 56 that straddles and connects to P-substrate 64.

The SCR is a P-N-P-N structure that can be modeled as PNP transistor 82 and NPN transistor 84. The base of PNP transistor 82 (center N-well 60) is also the collector of NPN transistor 84. The collector of PNP transistor 82 (P-substrate 64) is also the base of NPN transistor 84. Resistor 86 is primarily the resistance of P-substrate 64 before P+ well tap 34.

PNP transistor 82 has Anode A and P+ anode/source 54 as its emitter, center N-well 60 as its base, and P-substrate 64 as its collector. Resistor 87 is the resistance of center N-well 60 to center N+ tap 30 that connects to anode A. A separate resistor can be added to resistor 87, such as resistor 48 in FIG. 10.

In one theoretical interpretation, once enough current flows through resistor 86 to produce a voltage drop of about 0.5 volt, the base-emitter junction in NPN transistor 84 turns on, pulling more current from its collector which is also the base of PNP transistor 82. As more current is pulled from the base of PNP transistor 82 by the collector of NPN transistor 84, PNP transistor 82 increases conduction rapidly, which rapidly increases the SCR current.

NPN transistor 84 has center N-well 60 as its collector, P-substrate 64 as its base, and outer N-well 62 and N+ well taps 32 to cathode K as its emitter. PNP transistor 82 is bypassed by triggering PMOS transistor 55, which turns on more easily than does PNP transistor 82. The gate of triggering PMOS transistor 55 is driven by NTRIG from trigger circuit 67.

Figure 8:
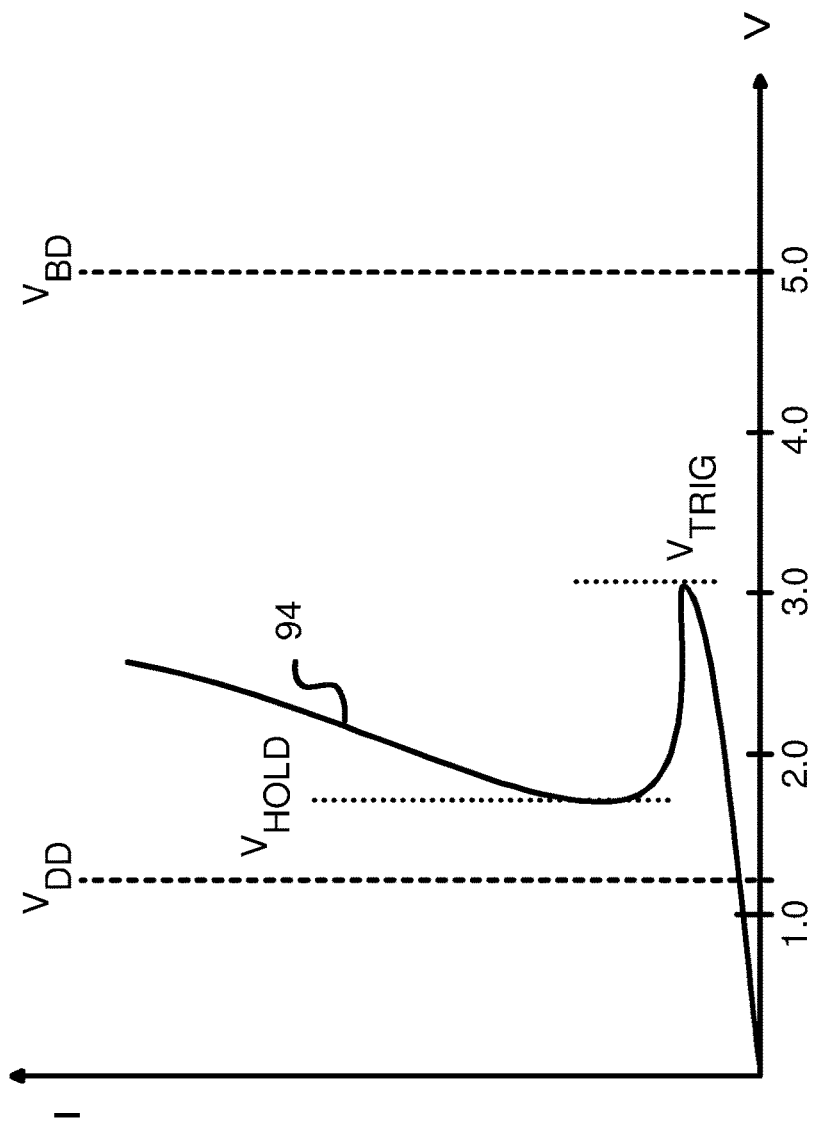
FIG. 8 is an I-V graph for the ESD-protection structure of FIG. 5.

FIG. 8 is an I-V graph for the ESD-protection structure of FIG. 5 with the SCR and PMOS trigger transistor. P+ guard ring 36 and N+ guard ring 38 suppress latch-up, causing holding voltage $V_{HOLD}$ to be greater than VDD.

Initially, at the start of an ESD event, the SCR is off. I-V curve 94 shows that the voltage rises from zero as substrate diodes turns on and conduct current until trigger voltage $V_{TRIG}$. Above about 3.0 volts, triggering PMOS transistor 55 turns on, raising the voltage of P-substrate 64. After some time to raise the voltage of P-substrate 64, the lateral SCR is triggered at trigger voltage $V_{TRIG}$. Then the lateral PNPN structure turns on and a larger current flows from node A to node K. Just after trigger voltage $V_{TRIG}$, as the current increases, the lateral SCR shunts the most current.

The triggering current from P+ drain 56 and triggering PMOS transistor 55 decreases the trigger voltage. I-V curve 94 shows a snap back at trigger voltage $V_{TRIG}$. The voltage drops after trigger voltage $V_{TRIG}$ as more current is carried by the SCR. Actual device curves may vary and show secondary effects not shown in simplified I-V curve 94.

Figure 9A:
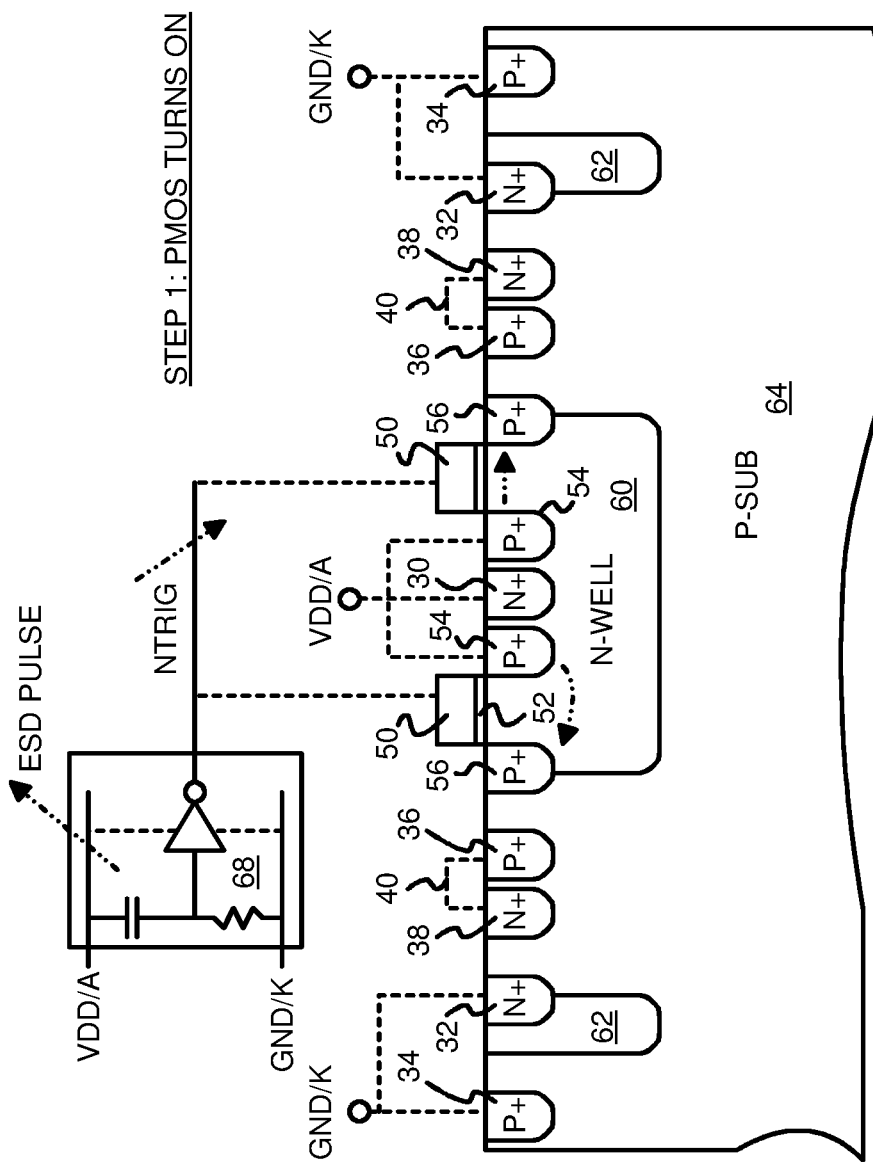
FIGS. 9A-C highlight operation of the ESD structure of FIG. 5.
Figure 9B:
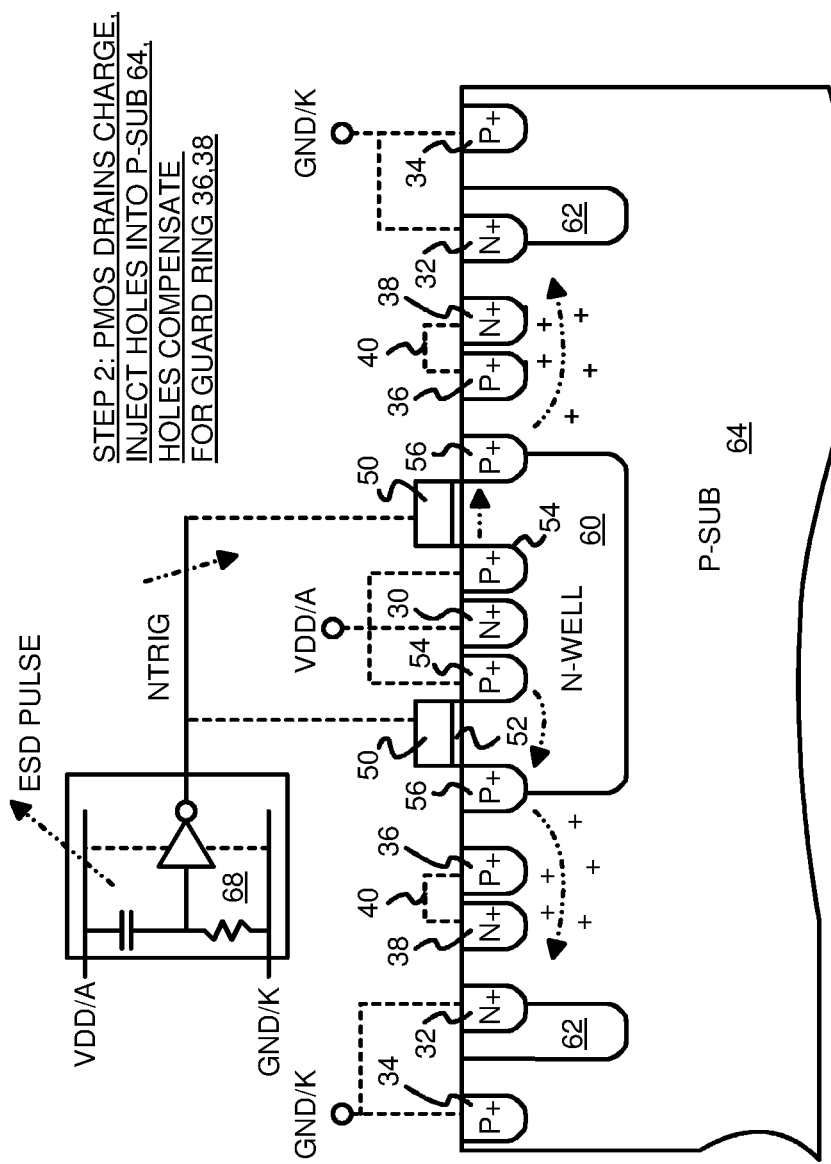
Figure 9C:
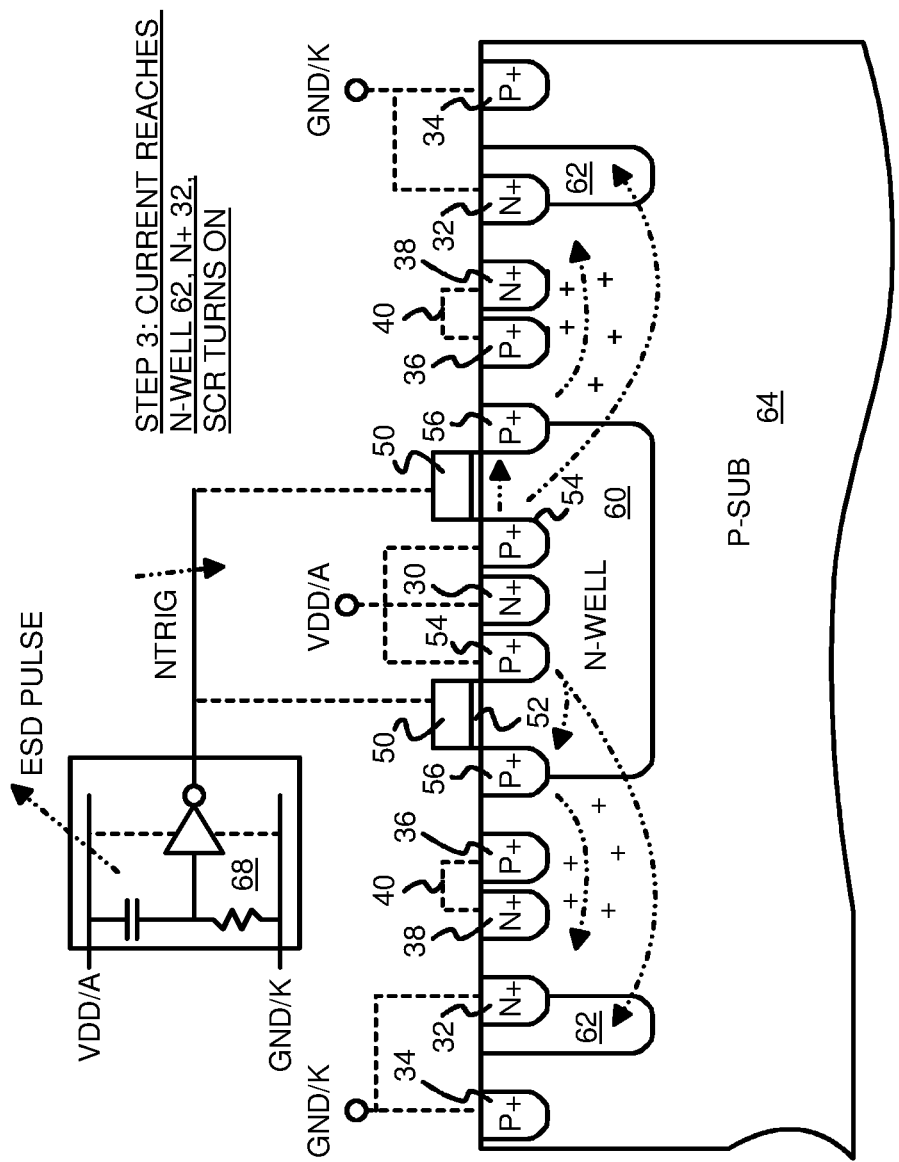

FIGS. 9A-C highlight operation of the ESD structure of FIG. 5. In FIG. 9A, at the start of an ESD event applied between terminals A and K, trigger circuit 68 detects the ESD pulse and drives trigger signal NTRIG low. One embodiment of trigger circuit 68 shown in FIGS. 9A-C has a capacitor and resistor in series between VDD and ground (A and K). During an ESD pulse, the capacitor is quickly charged high, causing the input to the inverter to go high, causing the inverter to drive output NTRIG low. Other kinds of trigger circuits may also be used.

The low-going NTRIG from trigger circuit 68 is applied to gates 50 of triggering PMOS transistor 55, turning triggering PMOS transistor 55 on. Positive current (holes) flow from P+ anode/source 54 to P+ drain 56. These holes are collected at P+ drain 56.

In FIG. 9B, as the current through triggering PMOS transistor 55 from P+ anode/source 54 to P+ drain 56 increases, and the charge on P+ drain 56 increases, some (hole) carriers cross the border of center N-well 60 and are injected into P-substrate 64. These carriers charge P-substrate 64. Since P+ drain 56 is located near P+ guard ring 36 and N+ guard ring 38, these carriers block or temporarily weaken the action of P+ guard ring 36 and N+ guard ring 38, allowing deeper current to flow within P-substrate 64 under P+ guard ring 36 and under N+ guard ring 38. The holes injected by P+ drain 56 compensate for the effect of P+ guard ring 36 and N+ guard ring 38. The SCR turns on more easily, at a lower trigger voltage $V_{TRIG}$ than if triggering PMOS transistor 55 were not present.

In FIG. 9C, the current flowing through P-substrate 64 from P+ drain 56 reaches outer N-well 62 rather than being absorbed by P+ guard ring 36 or N+ guard ring 38. The current that reaches outer N-well 62 flows through N+ well taps 32 to cathode K.

Current conducts in the parasitic PNP transistor under triggering PMOS transistor 55 from P+ anode/source 54 to center N-well 60 and is collected by P-substrate 64.

This positive current flow under triggering PMOS transistor 55 allows N+ well taps 32 and outer N-well 62 to begin emitting electrons into P-substrate 64. These electrons flow across P-substrate 64, which is the base of NPN transistor 84, until being collected by center N-well 60, which acts as the collector. However, center N-well 60 is also the base of PNP transistor 82, and this additional base current turns on PNP transistor 82 more strongly, causing more positive current to flow from emitter P+ anode/source 54, through base center N-well 60, and into collector P-substrate 64. Thus the SCR action is initiated and a very large SCR current may be shunted between anode A and cathode K, P+ anode/source 54 to N+ well taps 32 and outer N-well 62.

Since the SCR has a large junction area for P-substrate 64 to outer N-well 62, a large current may flow while still having a relatively low current density, preventing thermal damage. The channel area for triggering PMOS transistor 55 is much smaller since it is contained within center N-well 60, which is smaller and inside of P-substrate 64. Also, any substrate current that leaks out of triggering PMOS transistor 55 is eventually collected by outer N-well 62 that surrounds triggering PMOS transistor 55.

Figure 10:
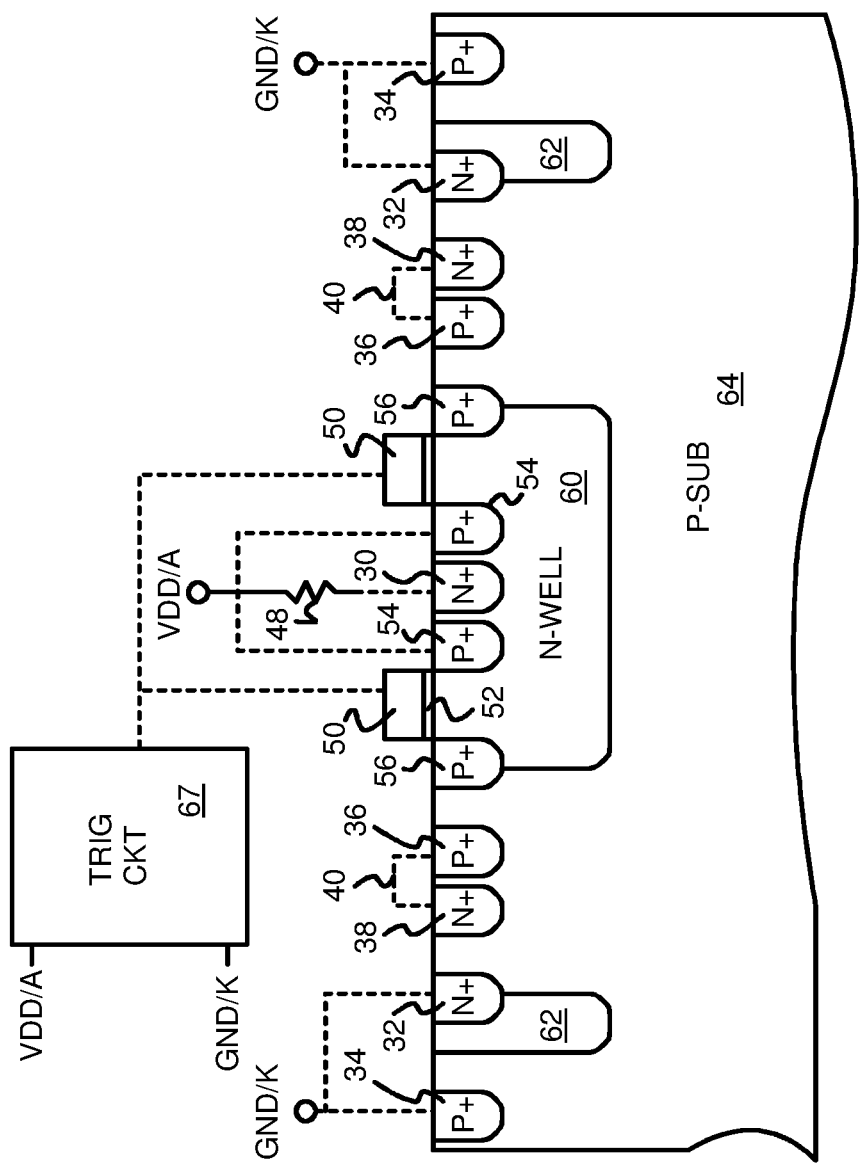
FIG. 10 is an alternative ESD structure with an anode resistor.

FIG. 10 is an alternative ESD structure with an anode resistor. Anode resistor 48 is inserted between anode A and center N+ tap 30 to center N-well 60. Anode resistor 48 increases the resistance and voltage drop to center N-well 60, helping to increase diode voltages and facilitate SCR turn on. Otherwise the ESD structure of FIG. 10 operates as described for the ESD structure of FIG. 5.

Figure 11:
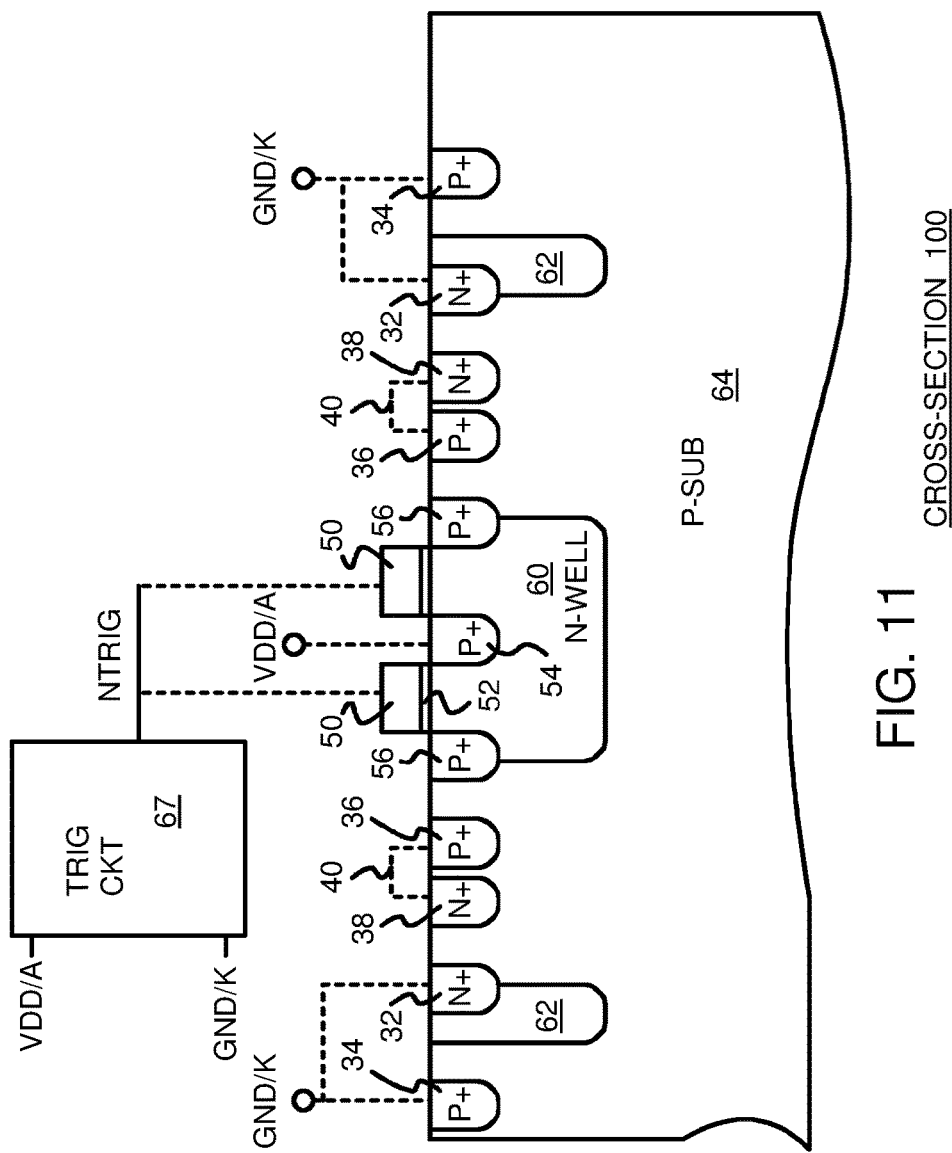
FIG. 11 is another alternative ESD structure with an offset center N+ tap.

FIG. 11 is another alternative ESD structure with an offset center N+ tap. Center N+ tap 30 is offset from the center of center N-well 60 and is not visible in cross section 100 shown in FIG. 11. The two P+ anode/sources 54 can be merged together into a single P+ anode/source 54 that is between two gates 50 for two triggering PMOS transistors 55. Center N-well 60 can be smaller in size using the offset center N+ tap 30 of FIGS. 11-12 than in the embodiment of FIG. 5. The ESD structure of FIGS. 11-12 operates as described for the ESD structure of FIG. 5.

Figure 12:
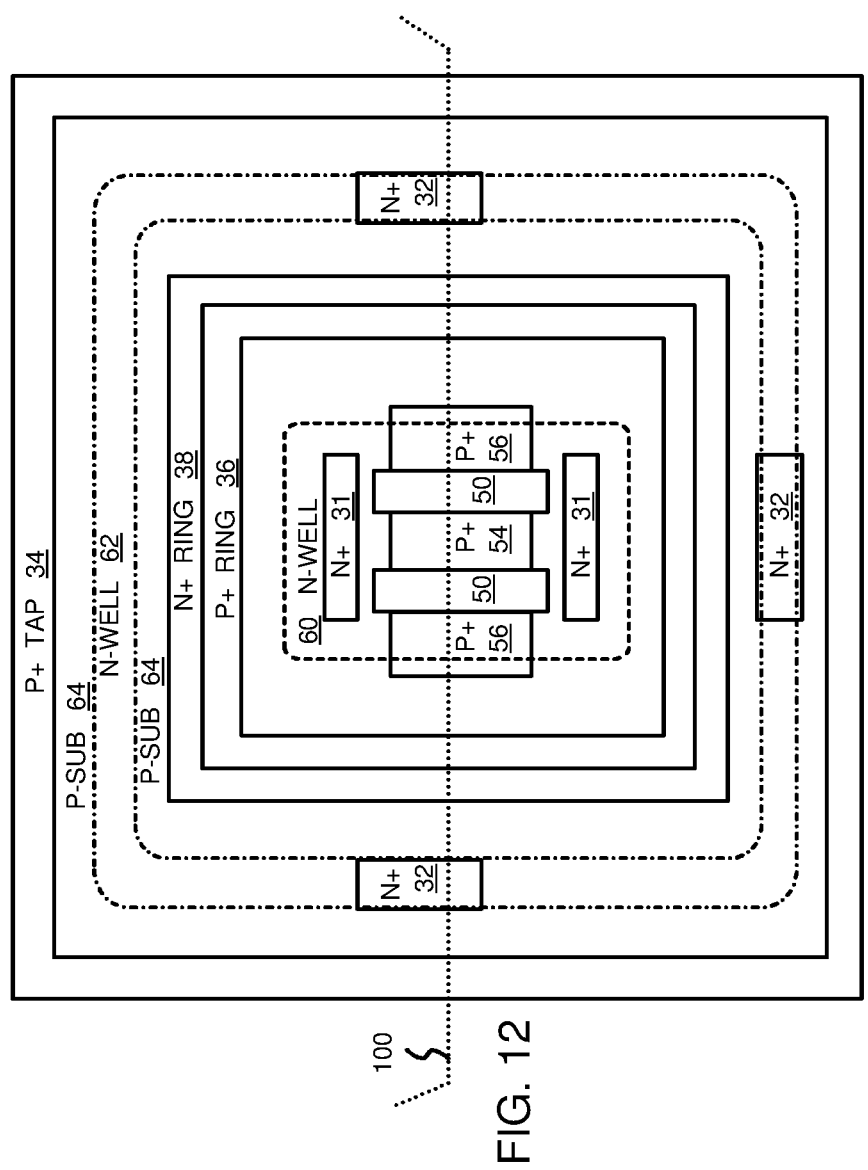
FIG. 12 is a top layout view of the ESD structure of FIG. 11.

FIG. 12 is a top layout view of the ESD structure of FIG. 11. Gates 50 are formed between one shared P+ anode/source 54 and two P+ drains 56. P+ drains 56 straddle the edge of center N-well 60 to make contact with P-substrate 64. Center N-well 60 is connected to anode A by offset center N+ taps 31 that are above and below P+ anode/source 54 within center N-well 60. Offset center N+ taps 31 are not present in cross section 100, but still provide a connection to center N-well 60.

P+ guard ring 36 and N+ guard ring 38 surround center N-well 60. These guard rings reduce latch-up susceptibility, causing the holding voltage $V_{HOLD}$ to be above VDD. N+ well taps 32 connect to outer N-well 62 and to cathode K. P-substrate 64 is also connected to cathode K by P+ well tap 34. P+ well tap 34 could be a continuous ring as shown, or could have smaller segments such as shown for N+ well taps 32. Likewise, N+ well taps 32 could be a continuous ring rather than have 4 separate segments as shown in FIG. 12.

Alternate Embodiments

Several other embodiments are contemplated by the inventors. For example, many variations of trigger circuit 67 or trigger circuit 68 are possible. The width of the NTRIG pulse generated may be adjusted by varying the R-C time constant of trigger circuit 68, or by adding delay elements such as strings of inverters. Beside tuning the pulse width of the NTRIG signal, the sensitivity of detecting the ESD pulse strength can also be tuned.

Figure 13:
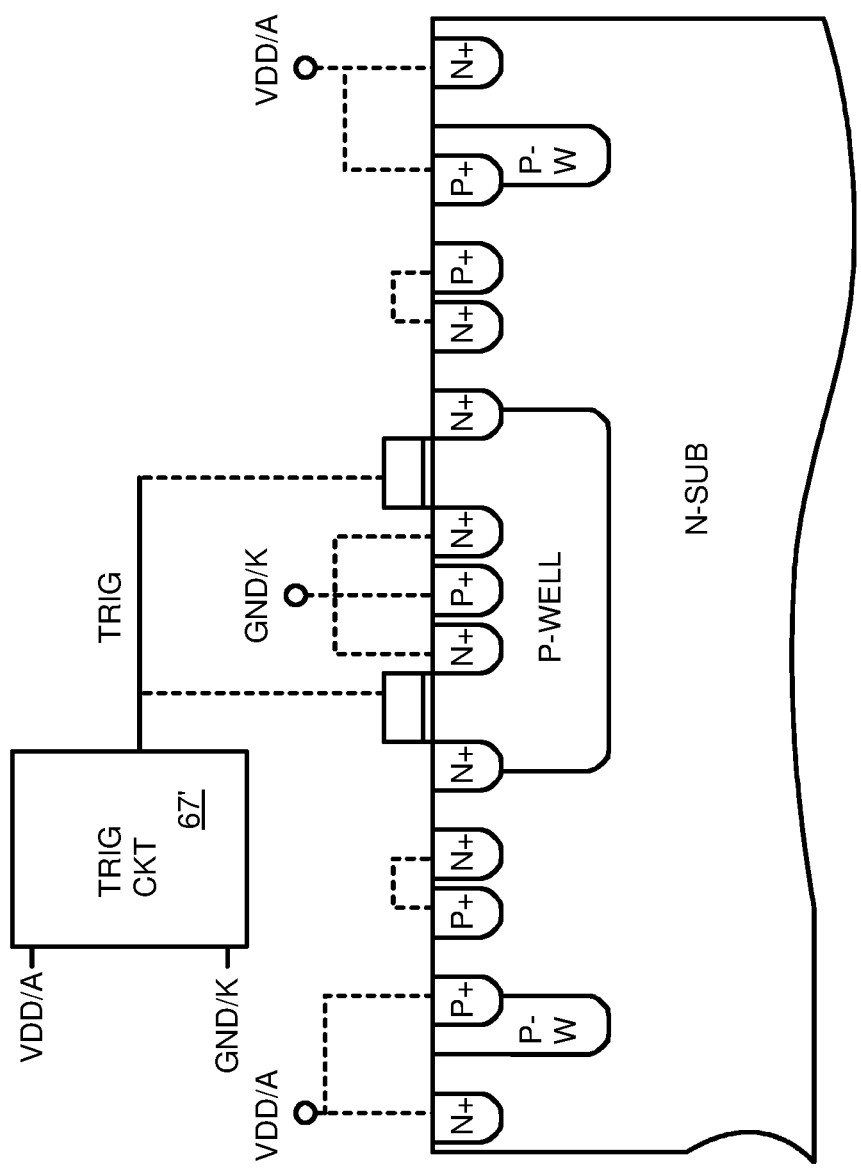
FIG. 13 shows an alternative using an inverted process.

The alternatives of FIGS. 5 and 10-12 may be combined in various ways, or used separately or in other combinations. While p-channel complementary metal-oxide-semiconductor (CMOS) transistors have been described, other kinds of transistors could be substituted for some embodiments, such as n-channel only, p-channel only, or various alternate transistor technologies such as Bipolar or BiCMOS. The technology process may use N-type instead of P-type. Other dopants should also be inverted accordingly. FIG. 13 shows an alternative using an inverted process.

While descriptions of current flows and operations have been presented, these are theoretical and the theories may be incomplete or even incorrect. Regardless of the physical mechanisms and theoretical interpretations, the structure does offer protection from ESD pulses. Especially for small devices, currents may flow in unusual ways and using mechanisms that have not yet been thoroughly researched and understood.

Cutouts in diffusion and other regions may be used. Other shapes and physical layouts may be substituted, such as intermingled fingers. While and offset center N+ tap 31 has been shown for FIGS. 11-12, in another embodiment center N+ tap 30 and offset center N+ tap 31 could be eliminated altogether and center N-well 60 left floating.

Devices may be implemented using n-channel, p-channel, or bipolar transistors, or junctions within these transistors. A capacitor could be attached to a resistance to provide an R-C time delay, or more complex circuits such as active triggering circuits may be added. In some embodiments, high-voltage transistors may be used rather than low-voltage transistors with appropriate bias conditions. The gate lengths can be increased to provide better protection from damage.

Different transistor, capacitor, resistor, and other device sizes can be used, and various layout arrangements can be used, such as multi-leg, ring, doughnut or irregular-shape transistors. Additional taps, guard rings, transistors, and other components may be added. The power node could be a common-discharge line (CDL) that normally floats rather than a power line. While a simple inverter of core transistors 22, 24 has been shown, more complex gates and interconnections may drive internal nodes, and there can be several internal nodes that connect to different input or output pads. The input/output pads may be connected to an input buffer, test-scan logic, and other circuits. More than one power supply may be used.

P and N wells could be reversed, and a NPNP lateral SCR used rather than a PNPN SCR. A deep P-well could be used or a deep N-well. Some embodiments may use an additional deep N+ or P+ implant region, or the location and depth of implant regions may be shifted. The final profiles and shapes of various layers such as center N-well 60, outer N-well 62, center N+ tap 30, P+ anode/source 54, P+ drain 56, and triggering PMOS transistor 55 may differ depending on the process used. In particular, deeper layers may shift around relative to the mask layouts. Also, the mask edges and final processed boundaries may differ with process steps. P+ drain 56 may straddle the edge of the final center N-well 60 so as to make electrical or physical contact with both center N-well 60 and P-substrate 64.

The shape of the SCR device may differ, such as by having a more rounded bottom or filed-oxide boundaries. Guard rings may be continuous, or have openings or cutouts for various reasons. P+ guard ring 36 and N+ guard ring 38 may be electrically connected together and left floating, or connected to a fixed voltage such as the power supply or ground, or may be connected to different voltages, such as connecting P+ guard ring 36 to ground and N+ guard ring 38 to the power supply. The voltage biases to P+ guard ring 36 and to N+ guard ring 38 may be actively switched, or muxed for various modes and conditions of operation.

Additional leaker devices such as resistors and small transistors could be added. Parasitic capacitances and resistances may be used from some components, depending on the process and device sizes used.

The ESD-protection circuit can be combined with other input-protection circuits, such as a power clamp circuit, other pad protection circuits, or a series-resistor protection circuit to the gate of an input buffer. Grounded-gate and thick oxide protection transistors and diodes can also be added at various points to increase ESD protection. One, two, of four of the PMOS-triggered SCR structures could be added to each I/O pin, or just to input pins.

Figure 1:
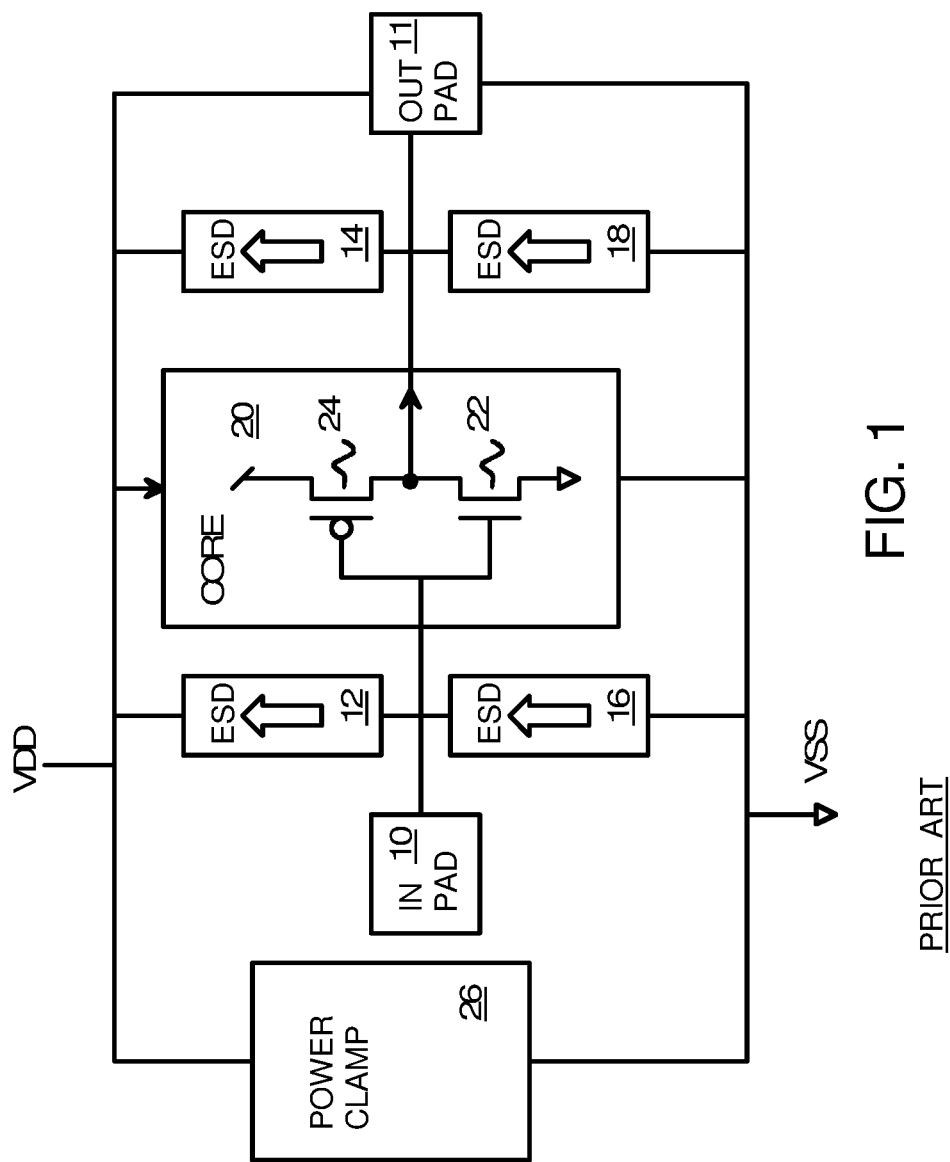
FIG. 1 shows a chip with several ESD-protection clamps.
Figure 2:
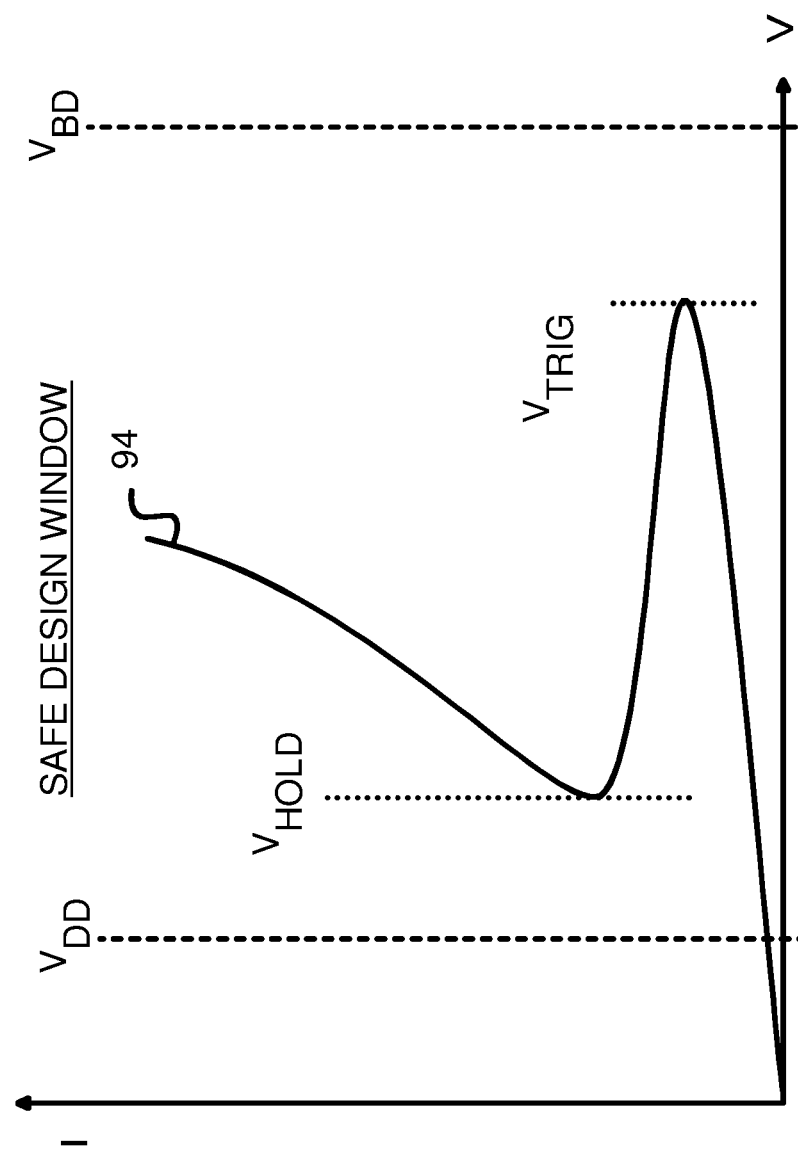
FIG. 2 shows a safe design window for an ESD protection device.
Figure 3:
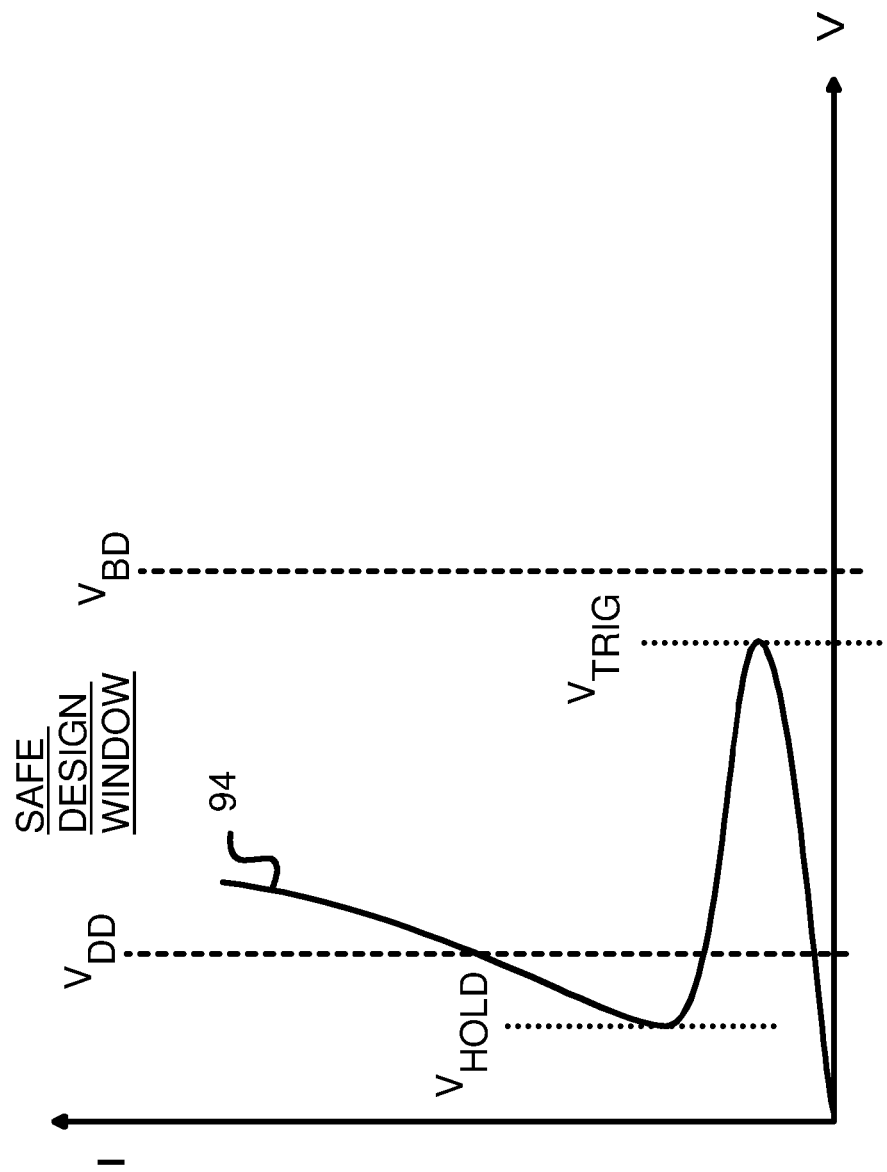
FIG. 3 shows a design window for a single-SCR ESD structure manufactured by an advanced process.
Figure 4:
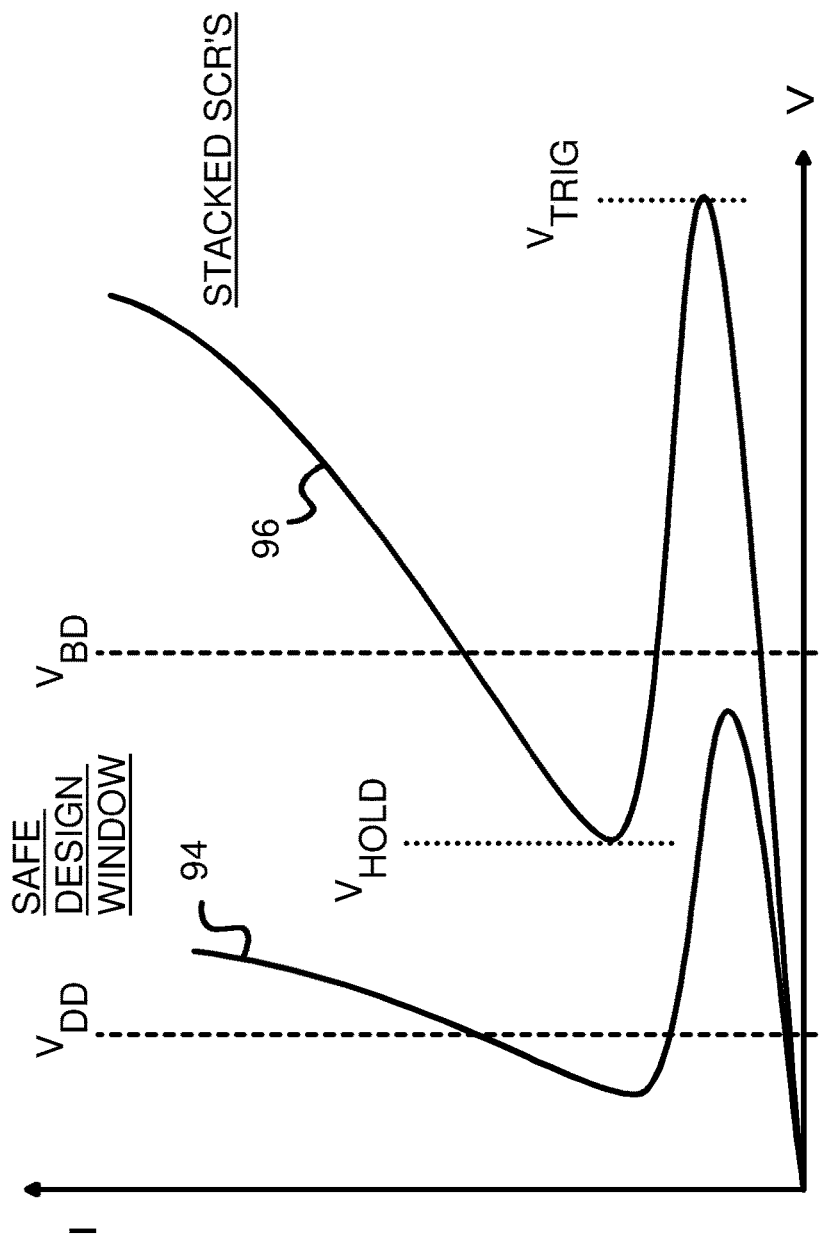
FIG. 4 shows a design window for a dual-SCR ESD structure manufactured by an advanced process.

Both thick oxide and thin oxide transistors may be protected by the power clamp and ESD protection devices. Alternately, several power clamps with different combinations of transistors and power-supply voltages may be used. Each pad may have only one ESD protection device, only two ESD protection devices, or four ESD protection devices as shown in FIG. 1. The anode and cathode (A and K) nodes may be reversed to swap the direction of protection.

Bias, VDD, and voltage values may vary somewhat due to process, temperature, and design variances. For example, the forward bias voltage may be 0.5 volt, +/−0.1 volt, the trigger voltage may be 4 volts, +/−0.5 volts, and the holding voltage may be 2 volts+/−0.5 volts. Other values are possible.

The snap-back breakdown voltage of triggering PMOS transistor 55 may vary somewhat from low-voltage transistors in core circuitry 20. For example, triggering PMOS transistor 55 may have a slightly longer channel length or other features to harden it, while low-voltage transistors in core circuitry 20 may use minimum channel lengths and dimensions. Snap-back voltages may vary with process, temperature, and exact geometries of the transistors. While descriptions of operation have been given based on a theoretical understanding of the physical processes, these theoretical descriptions may be incorrect. Second and third order effects may also be present. Various mechanisms may be responsible for breakdown and conduction under various conditions.

Large output driver transistors also act as large diodes for some ESD tests and conditions. For example, when the ESD pulse is applied across an I/O pad and the power-supply pad, a positive ESD pulse can turn on a parasitic p-n drain-substrate junction of the drain of the large p-channel driver transistor. The n-type substrate or well of the p-channel driver transistor is normally connected to the I/O power supply. Thus the p-n junction is forward biased by the positive ESD pulse. While output pads have been described, other connection technologies may be substituted, such as ball-grid-array (BGA), flip-chip, etc., and the term pads is considered to apply to all such balls, pads, landings, etc. that are for external connection.

Likewise, when the ESD pulse is applied across the I/O pad and the ground pad, a negative ESD pulse can turn on the parasitic n-p drain-substrate junction of the drain of the large n-channel driver transistor. The p-type substrate or well of the n-channel driver transistor is normally connected to the I/O ground. Thus the p-n junction is forward biased by the negative ESD pulse. Various cross-domain coupling paths and mechanisms may exist that couple ESD pulses applied to one power-supply domain to another power-supply domain.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. An Electro-Static-Discharge (ESD) protection structure comprising:
a center N-well formed in a P-substrate;

a P+ anode/source formed in the center N-well, the P+ anode/source connected to an anode terminal for receiving an ESD pulse;
a P+ drain formed along an edge of the center N-well, wherein the P+ drain makes physical contact with both the center N-well and the P-substrate;
a P-channel Metal-Oxide-Semiconductor (PMOS) transistor formed in the center N-well, the PMOS transistor having a gate driven by an inverse trigger signal that is driven low during the ESD pulse, the gate controlling conduction in a channel between the P+ anode/source and the P+ drain;
an outer N-well that has an N+ well tap that connects to a cathode terminal for the ESD pulse;
a guard ring located between the center N-well and the outer N-well, the guard ring for reducing susceptibility to latch-up, and
a second P+ drain formed along an edge of the center N-well, wherein the second P+drain makes physical contact with both the center N-well and the P-substrate; and
a second PMOS transistor formed in the center N-well, the second PMOS transistor having a second gate driven by the inverse trigger signal that is driven low during the ESD pulse, the second gate controlling conduction in a second channel between the P+ anode/source and the second P+ drain;
wherein the P+ anode/source is shared by the PMOS transistor and the second PMOS transistor.

2. The ESD protection structure of claim 1 wherein the PMOS transistor turns on during the ESD pulse, conducting holes from the P+ anode/source to the P+ drain;
wherein the P+ drain injects holes into the P-substrate near the guard ring;
wherein the holes injected by the P+ drain temporarily suppress an effect of the guard ring while the PMOS transistor is turned on.

3. The ESD protection structure of claim 2 wherein a trigger voltage of the ESD protection structure is reduced when the PMOS transistor is turned on to inject holes into the P-substrate near the guard ring, the trigger voltage having a larger value when the PMOS transistor is turned off than when the PMOS transistor is turned on.

4. The ESD protection structure of claim 3 wherein a Silicon-Controlled Rectifier (SCR) is formed by the P+ anode/source, the center N-well, the P-substrate, and the outer N-well.

5. The ESD protection structure of claim 4 wherein the SCR turns on to conduct when the trigger voltage is reached.

6. The ESD protection structure of claim 1 wherein the guard ring comprises:
a P+ guard ring; and
an N+ guard ring.

7. The ESD protection structure of claim 6 wherein the guard ring completely surrounds the center N-well.

8. The ESD protection structure of claim 6 wherein the P+ guard ring and the N+ guard ring are electrically connected to each other.

9. The ESD protection structure of claim 1 further comprising:
a trigger circuit that receives the ESD pulse, the trigger circuit generating the inverse trigger signal, the trigger circuit driving the inverse trigger signal low when the trigger circuit detects the ESD pulse.

10. The ESD protection structure of claim 9 wherein the trigger circuit comprises:

a capacitor coupled between the anode terminal and a sense node;
a resistor coupled between the sense node and the cathode terminal; and
an inverter having the sense node as an input and an output driving the inverse trigger signal.

11. The ESD protection structure of claim 1 further comprising:
a center N+ tap formed within the center N-well.

12. The ESD protection structure of claim 11 further comprising:
an anode resistor, coupled between the center N+ tap and the anode terminal.

13. The ESD protection structure of claim 1 further comprising:
an offset center N+ tap formed within the center N-well, for connecting to the anode terminal directly or through an anode resistor.

14. An Electro-Static-Discharge (ESD) protection structure comprising:
a center N-well formed in a P-substrate;
a P+ anode/source formed in the center N-well, the P+ anode/source connected to an anode terminal for receiving an ESD pulse;
a P+ drain formed along an edge of the center N-well, wherein the P+ drain makes physical contact with both the center N-well and the P-substrate;
a P-channel Metal-Oxide-Semiconductor (PMOS) transistor formed in the center N-well, the PMOS transistor having a gate driven by an inverse trigger signal that is driven low during the ESD pulse, the gate controlling conduction in a channel between the P+ anode/source and the P+ drain;
an outer N-well that has an N+ well tap that connects to a cathode terminal for the ESD pulse;
a guard ring located between the center N-well and the outer N-well, the guard ring for reducing susceptibility to latch-up;
a second P+ drain formed along an edge of the center N-well, wherein the second P+drain makes physical contact with both the center N-well and the P-substrate;
a second P+ anode/source formed in the center N-well, the second P+ anode/source connected to the anode terminal that receives the ESD pulse; and
a second PMOS transistor formed in the center N-well, the second PMOS transistor having a second gate driven by the inverse trigger signal that is driven low during the ESD pulse, the second gate controlling conduction in a second channel between the second P+ anode/source and the second P+ drain.

15. The ESD protection structure of claim 14 further comprising:
a center N+ tap formed within the center N-well, for connecting to the anode terminal directly or through an anode resistor;
wherein the center N+ tap is formed between the P+ anode/source and the second P+anode/source.

16. The ESD protection structure of claim 14 wherein during a normal operation mode, the cathode terminal is connected to a ground supply and the anode terminal is connected to a power supply.

17. An input protection device comprising:
a Silicon-Controlled Rectifier (SCR) that comprises a PNPN structure that comprises:
a P+ anode/source connected to a first terminal for receiving an electrical shock pulse;
a center N-well;

a P-substrate that surrounds the center N-well;
an outer N-well connected to a second terminal for receiving the electrical shock pulse;
a guard ring placed in the P-substrate between the center N-well and the outer N-well;
a p-channel transistor formed in the center N-well;
a P+ drain formed to straddle a boundary between the center N-well and the P-substrate;
a gate for controlling a channel in the p-channel transistor, the channel carrying current from the P+ anode/source to the P+ drain; and
a trigger circuit that receives the electrical shock pulse and generates a low-going signal to the gate when the electrical shock pulse is detected;
wherein the p-channel transistor turns on when the electrical shock pulse is detected, the p-channel transistor charging the P+ drain and causing the P+ drain to inject electrical carriers into the P-substrate;

a second P+ drain formed along an edge of the center N-well, wherein the second P+ drain makes physical contact with both the center N-well and the P-substrate; and
a second p-channel transistor formed in the center N-well, the second p-channel transistor having a second gate driven by the low-going signal that is generated by the electrical shock pulse, the second gate controlling conduction in a second channel between the P+ anode/source and the second P+ drain;
wherein the P+ anode/source is shared by the p-channel transistor and the second p-channel transistor,
whereby the SCR turns on at a lower voltage when the p-channel transistor is turned on to inject the electrical carriers that temporarily suppress an effect of the guard ring.

\* \* \* \* \*